United States Patent
Ikushima (10) Patent No.: US 9,144,820 B2
(45) Date of Patent: Sep. 29, 2015

(54) EJECTION AMOUNT CORRECTION METHOD AND COATING APPARATUS

(75) Inventor: Kazumasa Ikushima, Mitaka (JP)

(73) Assignee: MUSASHI ENGINEERING, INC., Mitaka-shi (JP)

( * ) Notice: Subject to any disclaimer, the term of this patent is extended or adjusted under 35 U.S.C. 154(b) by 518 days.

(21) Appl. No.: 12/918,967

(22) PCT Filed: Feb. 19, 2009

(86) PCT No.: PCT/JP2009/000694
§ 371 (c)(1),
(2), (4) Date: Nov. 9, 2010

(87) PCT Pub. No.: WO2009/104398
PCT Pub. Date: Aug. 27, 2009

(65) Prior Publication Data
US 2011/0045167 A1    Feb. 24, 2011

(30) Foreign Application Priority Data

Feb. 22, 2008   (JP) ................................ 2008-042061

(51) Int. Cl.
| | |
|---|---|
| *B05C 11/00* | (2006.01) |
| *C23C 16/52* | (2006.01) |
| *B05C 11/10* | (2006.01) |
| *H01L 21/67* | (2006.01) |

(Continued)

(52) U.S. Cl.
CPC .............. *B05C 11/1005* (2013.01); *B05C 11/10* (2013.01); *H01L 21/6715* (2013.01); *H05K 1/0269* (2013.01); *H05K 3/3484* (2013.01)

(58) Field of Classification Search
None
See application file for complete search history.

(56) References Cited

U.S. PATENT DOCUMENTS 5,856,200 A * 1/1999 Krause et al. ................. 436/180
6,001,309 A * 12/1999 Gamble et al. ................ 422/507

(Continued)

FOREIGN PATENT DOCUMENTS

| CN | 1140789 C | 3/2004 |
|---|---|---|
| CN | 1607378 A | 4/2005 |

(Continued)

OTHER PUBLICATIONS

Supplementary European Search Report dated Apr. 3, 2012, issued in corresponding European Patent Application No. 09 71 2114, (2 pages).

(Continued)

*Primary Examiner* — Dah-Wei D Yuan
*Assistant Examiner* — Jethro M Pence
(74) *Attorney, Agent, or Firm* — Westerman, Hattori, Daniels & Adrian, LLP (57) ABSTRACT

Provided is an ejection amount correction method and an applying apparatus, which can correctly measure the amount of an applied droplet and accurately correct the ejection amount. In an ejection amount correction method for measuring the amount of a liquid material ejected from a nozzle and correcting the ejection amount of the liquid material, a mirror is set near an application target surface at a predetermined angle with respect to the application target surface, an image of a droplet formed on the application target surface is picked up from a side through the mirror, the volume of the droplet is calculated based on the picked-up image of the droplet, and the ejection amount is corrected based on the calculated volume. An apparatus for carrying out the method is also provided.

9 Claims, 11 Drawing Sheets

(51) Int. Cl.
*H05K 1/02* (2006.01)
*H05K 3/34* (2006.01)

(56) References Cited

U.S. PATENT DOCUMENTS

| | | | |
|---|---|---|---|
| 7,204,573 B2 | 4/2007 | Koyama | |
| 2002/0071772 A1* | 6/2002 | Isogai et al. | 417/292 |
| 2005/0223917 A1* | 10/2005 | Bang et al. | 101/123 |
| 2005/0274969 A1* | 12/2005 | Suzuki | 257/98 |
| 2007/0209454 A1 | 9/2007 | Joo et al. | |
| 2007/0223917 A1 | 9/2007 | Nagamine | |

FOREIGN PATENT DOCUMENTS

| | | |
|---|---|---|
| JP | 11-97829 A | 4/1999 |
| JP | 2002-303275 A | 10/2002 |
| JP | 2003-254810 A | 9/2003 |
| JP | 2005-119139 A | 5/2005 |
| JP | 2006-136836 A | 6/2006 |
| JP | 2006-167534 A | 6/2006 |
| JP | 2007-132929 A | 5/2007 |
| JP | 2007-229928 A | 9/2007 |
| TW | I282750 | 6/2007 |
| TW | 200734065 A | 9/2007 |

OTHER PUBLICATIONS

International Search Report for PCT/JP2009/000694, mailing date of May 26, 2009.

Taiwanese Search Report dated Feb. 25, 2014, issued in Taiwanese Patent Application No. 098105399, w/ English translation, (3 pages).

* cited by examiner

EJECTION AMOUNT CORRECTION METHOD AND COATING APPARATUS

TECHNICAL FIELD

The present invention relates to a method for correcting changes in ejection amount of a liquid material, which are caused due to, e.g., changes in viscosity of the liquid material with the lapse of time, and to an applying apparatus. More particularly, the present invention relates to a method for measuring the amount of a droplet of the liquid material applied to a substrate and correcting the ejection amount of the liquid material based on the measured value, and to an applying apparatus.

BACKGROUND ART

Regarding a technique for ejecting the liquid material in a constant amount, there has hitherto been a problem that, when the ejection is performed for a long time, the liquid material causes a time-dependent change in viscosity thereof and the ejection amount of the liquid material varies.

Recently, with further downsizing and higher-density packaging of chips or with more versatility of application work, there have been not only a demand for continuously performing fine application of the liquid material in a very small amount, but also a need for suppressing a variation in the ejection amount of the liquid material to a lower level. Above all, in the underfill step, even finer application of the liquid material in an even smaller amount is required.

As techniques for coping with the variation in the ejection amount of the liquid material by measuring the amount of the ejected liquid material with the aid of a dedicated measuring device and adjusting the ejection amount based on the measured result, there are known an ejection amount correction method of measuring the weight of the liquid material by using an electronic scale (Patent Document 1), and a device for picking up an image of a droplet of the liquid material and measuring the amount of the droplet based on the picked-up image (Patent Document 2).

Patent Document 1 discloses an ejection amount correction method comprising the steps of periodically measuring the weight of the ejected material, comparing the measured weight with a specified weight, and when the measured weight and the specified weight differ from each other, making control for correcting a number of pulses and a pulse frequency, which are used to drive a pulse motor pump, such that the measured weight comes closer to the specified weight.

Patent Document 2 discloses an application amount adjustment method comprising the steps of registering a target application amount, supplying a gas pressure to a syringe to eject a bond from a nozzle for a trial application, recognizing the bond applied for a trial and calculating the magnitude of the application amount, comparing the calculated trial application amount with the target application amount to determine whether the difference between both the amounts is within an allowable error, and when the difference is not within the allowable error, repeating the above-mentioned steps while changing the magnitude of the gas pressure supplied to the syringe or a time during which the gas pressure is supplied to the syringe.

Patent Document 1: Japanese Patent Laid-Open Publication No. 2002-303275
Patent Document 2: Japanese Patent Laid-Open Publication No. H11-97829

DISCLOSURE OF THE INVENTION

Problems to be Solved by the Invention

However, the invention described in Patent Document 1 has the problem that, because the liquid material is received on a saucer, the measured value is not stabilized until fluctuations of the liquid surface is settled, and hence a relatively long time is taken to obtain the result of the measurement. A similar disadvantage is additionally caused with vibration of an apparatus and an influence of a downflow (i.e., an air flow blown from an air conditioner disposed in an upper portion of the apparatus for the purpose of maintaining the interior of the apparatus to be clean).

Further, in the invention described in Patent Document 2, because the amount of the droplet is calculated based on a silhouette of the liquid material recognized by a camera from above, the height of the droplet cannot be recognized and the amount of the droplet cannot be correctly calculated.

An object of the present invention is to provide an ejection amount correction method and an applying apparatus, which can correctly measure the amount of an applied droplet and accurately correct the ejection amount.

Means for Solving the Problems

According to a first aspect of the present invention, there is provided an ejection amount correction method for measuring the amount of a liquid material ejected from a nozzle and correcting the ejection amount of the liquid material, wherein a mirror is set near an application target surface at a predetermined angle with respect to the application target surface, an image of a droplet formed on the application target surface is picked up from a side through the mirror, the volume of the droplet is calculated based on the picked-up image of the droplet, and the ejection amount is corrected based on the calculated volume.

According to a second aspect of the present invention, in the method according to the first aspect, the mirror includes a plurality of mirrors arranged in orthogonal or symmetrical relation, the image of the droplet is picked up plural times at different angles in a horizontal direction, and the volume of the droplet is calculated based on the picked-up plural images of the droplet.

According to a third aspect of the present invention, in the method according to the first aspect, the droplet formed on the application target surface or the mirror is rotated, the image of the droplet is picked up plural times at different angles in a horizontal direction, and the volume of the droplet is calculated based on the picked-up plural images of the droplet.

According to a fourth aspect of the present invention, in the method according to any one of the first to third aspects, the volume of the droplet is calculated based on an area of a silhouette of the droplet as viewed from a side.

According to a fifth aspect of the present invention, in the method according to any one of the first to third aspects, the volume of the droplet is calculated based on a height and a width of a silhouette of the droplet as viewed from a side.

According to a sixth aspect of the present invention, in the method according to the fourth or fifth aspect, an image of the silhouette of the droplet as viewed from above is picked up, and when roundness of the silhouette as viewed from above exceeds an allowable range, the droplet is formed again on the application target surface.

According to a seventh aspect of the present invention, in the method according to any one of the first to sixth aspects, an image of the application target surface before forming the droplet on the application target surface is picked up from a side through the mirror, a boundary line of the application target surface is stored based on the picked-up image of the application target surface, and the volume of the droplet is calculated for a region of the picked-up image of the droplet, which is positioned above the boundary line.

According to an eighth aspect of the present invention, in the method according to any one of the first to seventh aspects, the predetermined angle is 45 degrees.

According to a ninth aspect of the present invention, there is provided an apparatus for applying a liquid material, the apparatus comprising a reservoir for reserving the liquid material, an ejection device provided with a nozzle for ejecting the liquid material, an image pickup device for picking up an image of a droplet applied to an application target surface, a mirror set near the application target surface at a predetermined angle with respect to the application target surface, and a control unit, wherein the image pickup device and the mirror are arranged at a position capable of picking up the image of the droplet formed on the application target surface from a side.

According to a tenth aspect of the present invention, the apparatus according to the ninth aspect further comprises a light source disposed in opposed relation to the mirror.

According to an eleventh aspect of the present invention, in the apparatus according to the ninth or tenth aspect, the mirror includes a plurality of mirrors arranged in orthogonal or symmetrical relation, and the image pickup device is positioned to be capable of picking up images of the droplet through the mirror at different angles in a horizontal direction.

According to a twelfth aspect of the present invention, the apparatus according to any one of the ninth to eleventh aspects further comprises a stage for rotating the droplet formed on the application target surface.

According to a thirteenth aspect of the present invention, the apparatus according to any one of the ninth to eleventh aspects further comprises a mirror that is rotatable with respect to the droplet formed on the application target surface.

According to a fourteenth aspect of the present invention, the apparatus according to the ninth or tenth aspect further comprises a conveying mechanism capable of moving the substrate in one direction, wherein the mirror is set near the conveying mechanism.

According to a fifteenth aspect of the present invention, the apparatus according to any one of the ninth to fourteenth aspects, the predetermined angle is 45 degrees.

Effect of the Invention

With the present invention, since the amount of the droplet can be correctly measured, the ejection amount can be accurately corrected.

Further, with the present invention, the amount of the droplet can be simply measured in principle.

DESCRIPTION OF REFERENCE CHARACTERS

A legend of main reference characters used in the drawings is as follows:

101 applying apparatus/102 XYZ drive mechanism/103 conveying mechanism/104 control unit/105 stage for adjustment/106 substrate for adjustment/107 mirror/108 image pickup device/109 substrate/110 objective surface of image pickup device/111 light source/201 droplet/301 ejection device/302 piston/303 reservoir/304 nozzle/305 ejection control unit/306 ejection signal line/307 compressed gas supply line/401 adjustment mechanism/601 axis of rotation/901 rotation drive mechanism/S area/h height/r radius/d diameter/α angle

BEST MODE FOR CARRYING OUT THE INVENTION

The best mode for carrying out the present invention will be described below, by way of example, in connection with the case of adjusting an "ejection pressure P" of a jet-type ejection device. Be it noted that the term "application length" means a total length representing a distance through which a nozzle and a substrate are moved relative to each other, and the term "ejection amount" means the amount of the liquid material ejected in one cycle of ejection work.

[1] Setting of Initial Parameters

First, a target volume $V_0$ and a target application length $L_0$ corresponding to the desired application of the liquid material are set. Next, an ejection time T is set based on the target application length $L_0$ and the desired application speed on condition that the application is performed at a constant speed. At that time, the "relationship between the ejection pressure and the ejection volume", which is resulted when the initially set ejection time is held fixed, is determined in advance based on a test, for example, and it is stored in a control unit 104 in the data form using a formula or a correspondence table. As a control parameter required for ejecting the target volume, an ejection pressure P is set based on the "relationship between the ejection pressure and the ejection volume". Those data stored in the control unit 104 are utilized as control data when the correction amount is calculated.

Moreover, a value calculated based on the pot life specified by the maker is preferably stored in advance as a limit value of a usable life of the liquid material in correlation to each of the above-mentioned data.

[2] Setting of Correction Period

A correction period, i.e., a timing at which the ejection amount is to be corrected, is set. The correction period is set, for example, as time information or the number of substrates 109 to be processed, which is input by a user. When the correction period is set in terms of time, a predetermined time is set at which a change in the ejection amount of the liquid material is expected to exceed an allowable range, counting from the start of the work. When the number of substrates is set, the number of substrates processed is determined from a time required for processing one substrate 109 (i.e., a time required for loading, application and unloading of one substrate) and the above-mentioned predetermined time, and is then set.

When the correction period is set, changes in viscosity of the liquid material caused with the lapse of time and temperature changes have to be taken into consideration. However, the following description is made on an assumption that only viscosity changes caused with the lapse of time are generated.

It is a matter of course that the known technique for controlling the viscosity of the liquid material with a temperature adjustment of an ejection unit including a nozzle can also be employed in the present invention in a combined manner.

[3] Calculation of Correction Amount (Measurement of Shape and Calculation of Volume)

A correction amount to compensate for the change in the ejection amount caused due to the change in viscosity of the liquid material is calculated at the timing of the set correction period.

First, a nozzle 304 is moved to a position above a substrate (106 or 109), and the liquid material is ejected in accordance with settings of the ejection pressure P and the ejection time T, which are stored as the control data in the control unit 104 as described in above [1]. A droplet 201 of the liquid material is thereby formed on an application target surface of the substrate. Subsequently, the shape of the droplet 201, as viewed in the horizontal direction, applied onto the substrate is picked up as an image, and a measured volume $V_1$ of the ejected droplet is calculated from data of the picked-up image. In more detail, an image pickup device 108 is moved to a position above a mirror 107, which is set near the substrate (106 or 109) at a predetermined angle with respect to the application target surface of the substrate, and an image of the shape of the droplet 201 is picked up in the direction parallel to the application target surface. On that occasion, a planar light source or a planar member serving as a background, which has a predetermined area, is preferably disposed in front of the mirror 107. Then, a geometrical quantity of the projected surface in the horizontal direction (i.e., in the direction parallel to the application target surface) is calculated based on data of the picked-up image, and the measured volume $V_1$ of the ejected droplet is calculated based on the calculated geometrical quantity of the projected surface in the horizontal direction.

The correction amount is obtained from comparison between the measured volume $V_1$, which has been measured as described above, and the target volume $V_0$, which has been set in above [1]. More specifically, a change rate R $(=(V_1-V_0)/V_0 \times 100)$ is first calculated from the measured volume $V_1$ and the target volume $V_0$. When the measured volume $V_1$ is less than the target volume $V_0$, the change rate R is minus, and when the measured volume $V_1$ is more than the target volume $V_0$, the change rate R is plus.

When the change rate R is minus, the setting of the ejection pressure in consideration of an increase of the ejection amount corresponding to the minus change rate R is obtained from the "relationship between the ejection pressure and the ejection volume", which has been stored in above [1].

When the change rate R is plus, the setting of the ejection pressure in consideration of a decrease of the ejection amount corresponding to the plus change rate R is obtained from the "relationship between the ejection pressure and the ejection volume", which has been stored in above [1].

Instead of always making the correction when the volume difference $(V_1-V_0)$ or the change rate R is not zero, the correction of the ejection amount is preferably executed only when the calculated volume difference or the change rate R exceeds an allowable range (e.g., ±5%). A preferred embodiment of the correction in the case of setting the allowable range is described in detail, for example, in Japanese Patent No. 3877038 that is issued on the basis of a patent application field by the applicant. In short, an allowable range for determining whether correction is to be made or not is set, and the ejection pressure is corrected only when a differential value or a change rate R exceeds the allowable range.

[4] Execution of Correction

When it is determined in above [3] that the correction of the ejection amount is required, the setting of the ejection pressure in consideration of an increase or a decrease of the ejection amount corresponding to the current change rate R is obtained from the "relationship between the ejection pressure and the ejection volume", which has been stored in above [1]. The ejection amount is then corrected by changing the setting of the control parameter (ejection pressure P).

The steps of above [3] and [4] are executed, for example, at the timing of the correction period set in above [2], or when the type (size or shape) of the substrate 109 is changed. As a result, the liquid material can be always applied in the optimum ejection amount regardless of time-dependent changes in viscosity of the liquid material.

[Modifications of Ejection Device]

The ejection device used in the present invention is not limited to the jet-type ejection device described above, and the present invention can be carried out in various types of ejection devices for ejecting the liquid material. The control parameter to be adjusted is not limited to the ejection pressure, and it may be any suitable one of the following examples.

In the jet-type ejection device, a time during which a piston is ascended, or a time during which the piston is descended may be adjusted.

In a screw-type ejection device in which the liquid material is ejected with rotation of a screw, the number of rotations of the screw may be adjusted.

In the plunger-type ejection device in which the liquid material is ejected by moving, through a desired distance, a plunger that slides in close contact with an inner surface of a reservoir having a nozzle at a fore end thereof, the distance through which the plunger is moved may be adjusted.

Details of the present invention will be described in detail below, but the present invention is in no way restricted by the following embodiments.

Embodiment 1

[Applying Apparatus]

Figure 1:
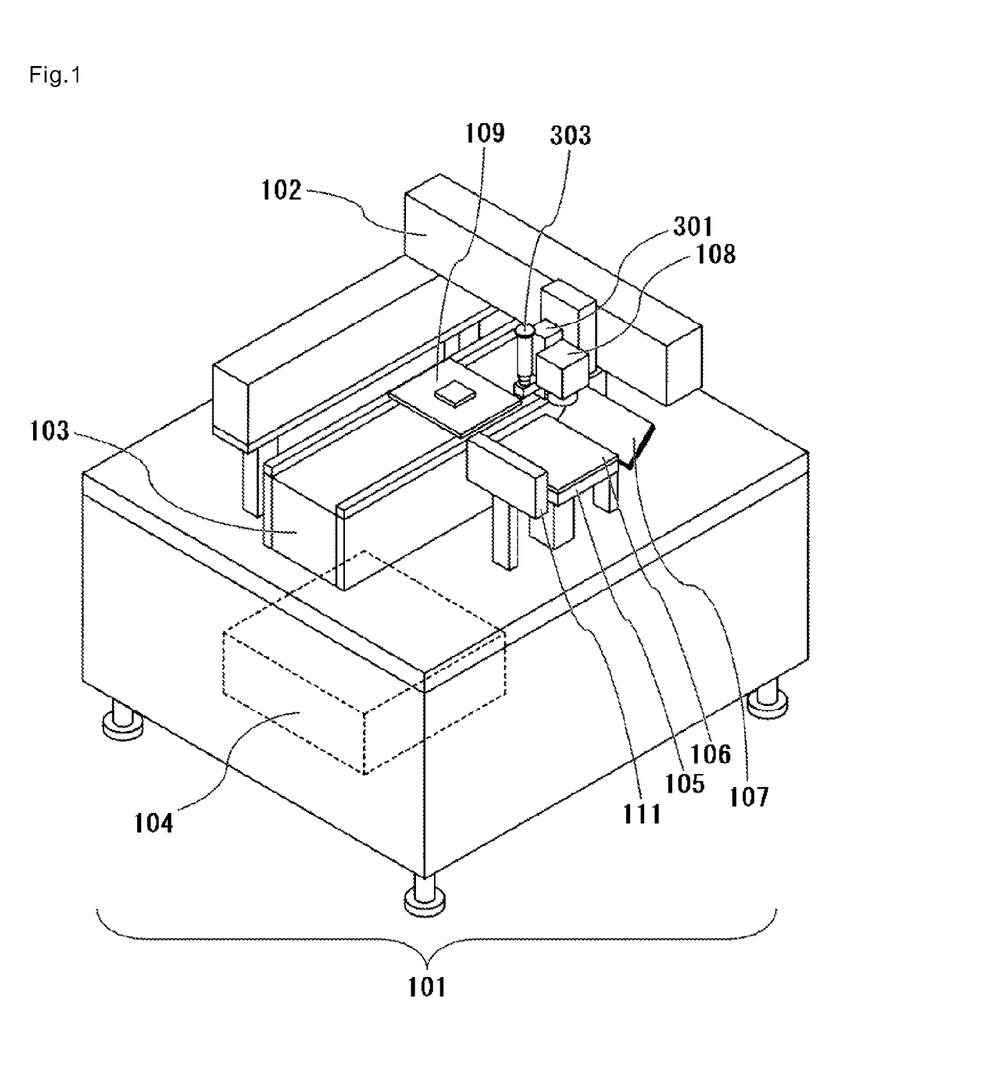
FIG. 1 is a schematic perspective view of an application apparatus according to Embodiment 1.

An applying apparatus 101 according to Embodiment 1 includes, as illustrated in FIG. 1, an ejection device 301, an image pickup device 108, an XYZ drive mechanism 102, a conveying mechanism 103, an adjustment mechanism 401 positioned near the conveying mechanism 103, and a control unit 104 for controlling operations of the former components.

The ejection device 301 includes a reservoir 303 for reserving the liquid material and a nozzle 304 for ejecting the liquid material. The ejection device 301 is mounted to the XYZ drive mechanism 102 and is movable to a location above the substrate 109 as an application target and a location above the substrate 106 for adjustment.

The image pickup device 108 is a device for picking up an image of the droplet ejected onto the substrate. In this embodiment, a CCD camera is used as the image pickup device 108 in consideration of that data of the picked-up image is subjected to image processing. The image pickup device 108 is mounted to the XYZ drive mechanism 102 such that an objective surface 110 through which the image is captured is in opposed relation to the application target surface of the substrate (106, 109). Similarly to the ejection device 301, the image pickup device 108 is also movable to a location above the substrate 109 as an application target and a location above the substrate 106 for adjustment, as well as to a location above the mirror 107. In addition, the image pickup device 108 is movable in the Z-direction for adjustment of the focal length.

Further, in this embodiment, the image pickup device 108 serves also as a later-described camera for recognizing the position of the substrate. Such dual use of one camera is effective in saving an installation space and in reducing the size of the applying apparatus 101.

Be it noted that when the image pickup device 108 is mounted to the XYZ drive mechanism 102, it may be integrally provided at a side of the ejection device 301 as illustrated in FIG. 1, or may be provided independently of the ejection device 301.

[Adjustment Mechanism]

The adjustment mechanism 401 includes the substrate 106 for adjustment, an adjustment stage 105 on which the substrate 106 for adjustment is placed, the mirror 107 set near the substrate 106 for adjustment, and a light source 111.

The substrate 106 for adjustment is a substrate used for measuring the amount of the liquid material ejected from the nozzle 304. The substrate 106 for adjustment is placed at the same level as the application target substrate 109. The reason resides in that such an arrangement can eliminates the necessity of adjustment of the focal length between recognition of the substrate in a positioning step and the image pick-up in a volume calculation step, when the image pickup device 108 is used also as the camera for recognizing the position of the substrate. In other words, the setting of the position in the Z-direction can be shared, whereby time and labor required for making separate settings for the substrates 106 and 109 can be saved.

Figure 2:
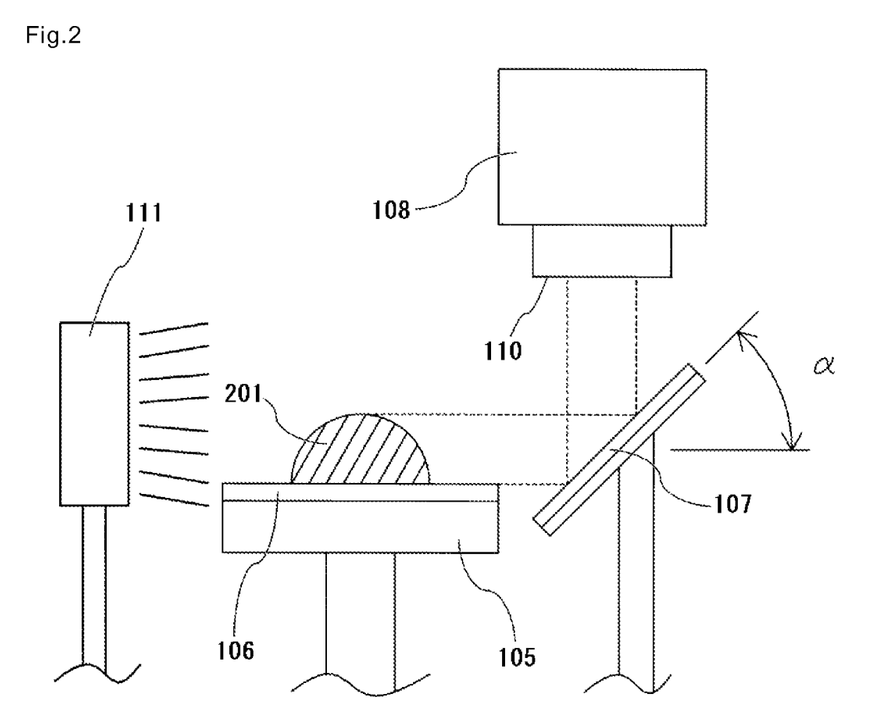
FIG. 2 is an explanatory view to explain setup of a mirror according to Embodiment 1.

As illustrated in FIG. 2, the mirror 107 is set at an angle α near the substrate 106 for adjustment. More specifically, the mirror 107 is set such that its surface reflecting an image is inclined at the angle α with respect to the application target surface of the substrate 106 for adjustment (i.e., the objective surface 110 of the image pickup device 108). By thus setting the mirror 107 at the angle α, a side image of the droplet 201 applied to the substrate (106, 109) can be picked up by the image pickup device 108 after being reflected by the mirror 107. In addition, the mirror 107 is set at such a height that the image of the droplet 201 is reflected at the center of the mirror 107 (see FIG. 2).

The light source 111 is a flat light (planar light source) that is arranged in a confronting relation to the mirror 107 with the substrate 106 for adjustment interposed between them. The light source 111 can be constituted by a known light source, e.g., an LED. Irradiating light toward the mirror 107 from the light source 111 is effective in making a silhouette of the droplet 201 clearer.

In the arrangement that the objective surface 110 of the image pickup device 108 is in opposed relation to the application target surface of the substrate (106, 109) as in this embodiment, the surface of the mirror 107 reflecting the image is preferably inclined at the angle α of 45 degrees with respect to the application target surface of the substrate (106, 109). By setting the angle α to be 45 degrees, the image of the droplet 201, as viewed in the horizontal direction, applied to the substrate (106, 109) can be reflected in the vertical direction, and the image of the droplet shape can be picked up without causing distortion, such as skewing.

While, in this embodiment, the side image of the droplet is made incident upon the image pickup device by using one mirror, a plurality of mirrors may be used to transfer the side image of the droplet to the image pickup device.

At the start of the application, the substrate 109 as the application target is first conveyed by the conveying mechanism 103 to a location under the ejection device 301. The application of the liquid material by the ejection device 301 is started after the substrate 109 has been conveyed to a location under the nozzle 304 and positioning of the substrate 109 has been finished. A locus along which the nozzle 304 is to be moved during the application operation, i.e., an application pattern, is previously stored in a storage device (e.g., a memory) inside the control unit 104.

After the end of the application, the substrate 109 is unloaded to the exterior of the applying apparatus 101 by the conveying mechanism 103. Subsequently, the next substrate 109 is loaded and the application work is repeated. Thus, the application work is repeated until the application of the liquid material to the desired number of substrates 109 is completed, while the loading, the application, and the unloading are carried out as one cycle.

During the above-described cycles, the correction of the ejection amount is performed at the timing of the preset correction period. In other words, the ejection amount that has changed due to the change in viscosity of the liquid material is corrected. The correction amount is calculated by moving the nozzle 304 to the location above the substrate 106 for adjustment with the XYZ drive mechanism 102, and by calculating the volume of the droplet 201 based on the data of the picked-up image of the droplet 201 that has been applied onto the substrate 106 for adjustment. Details of a correction procedure will be described later.

[Ejection Device]

Figure 3:
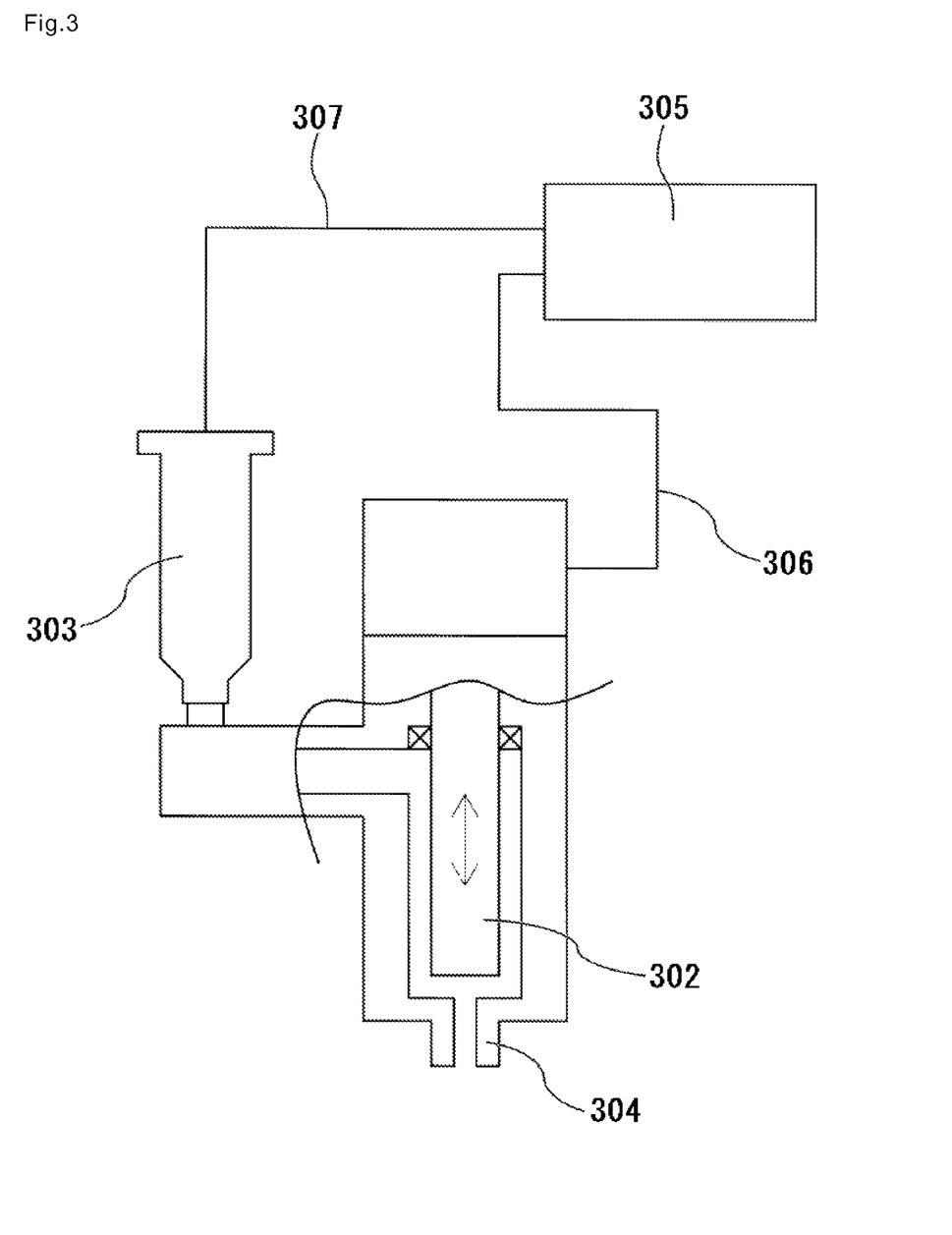
FIG. 3 is a sectional view of principal part of an ejection device according to Embodiment 1.

While various types of devices are usable as the ejection device 301, a jet-type ejection device illustrated in FIG. 3 is used in this embodiment.

The ejection device 301, illustrated in FIG. 3, includes a piston 302 disposed within the ejection device 301 in a vertically movable state, a reservoir 303 for reserving the liquid material, and the nozzle 304 communicating with the reservoir.

The liquid material in the reservoir 303 is pressurized by compressed gas that is under regulated pressure and that is supplied from the ejection control unit 305 via a compressed air supply line 307. The liquid material 210 supplied from the reservoir 303 to a piston chamber is ejected in the form of a droplet from the nozzle 304 by vertically reciprocating the piston 302 in accordance with an ejection signal, which is sent from the ejection control unit 305. The droplet 201 having been ejected from the nozzle 304 is applied in the form of a dot to the substrate (106, 109), which is positioned under the nozzle 304.

[Correction Procedure 1]

Figure 4:
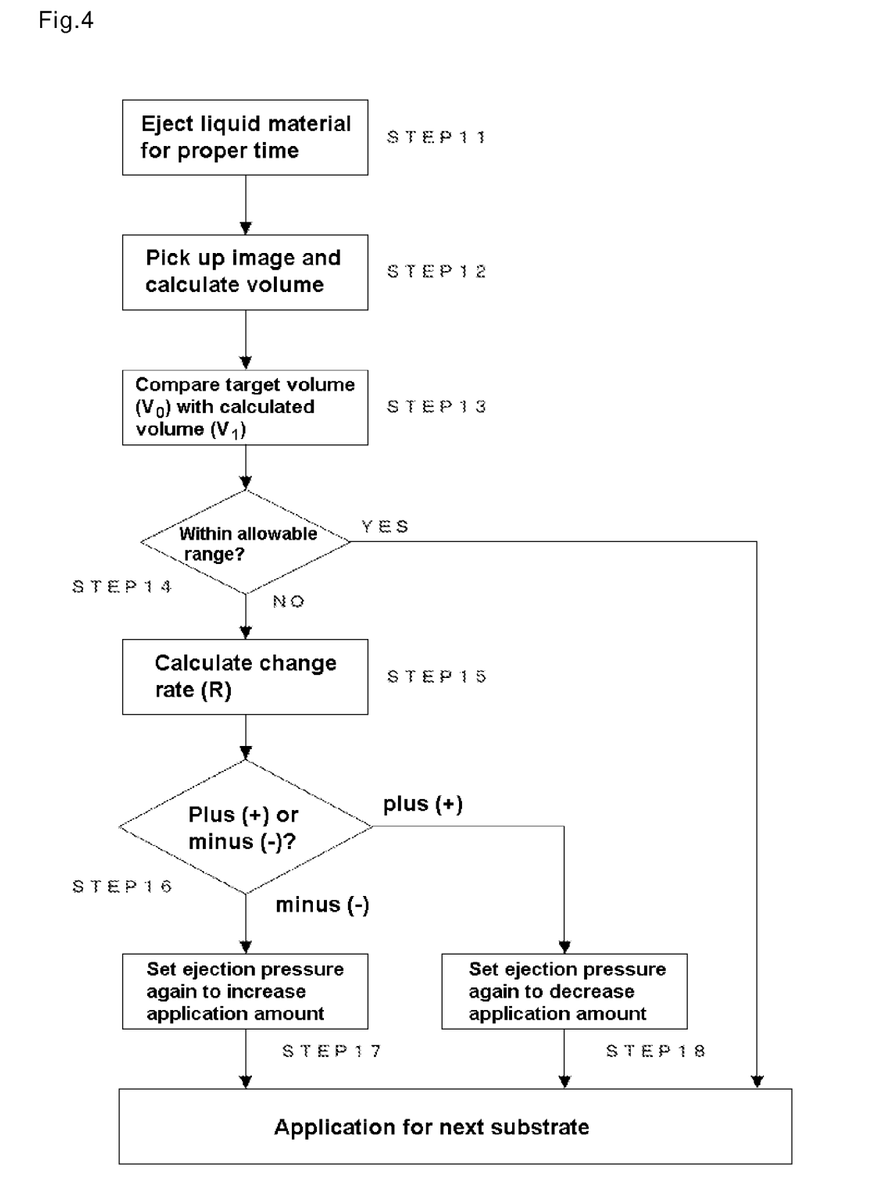
FIG. 4 is a flowchart illustrating a correction procedure according to Embodiment 1.

A correction procedure 1 in this embodiment is described with reference to a flowchart of FIG. 4.

First, a proper ejection time required for ejecting the liquid material in the target volume, which is obtained based on the relationship between the ejection pressure and the ejection volume, is calculated and the liquid material is ejected onto the substrate for the proper ejection time (STEP 11). Next, the shape of the droplet 201 as viewed in the horizontal direction (i.e., the shape of the droplet as viewed in the direction parallel to the application target surface of the substrate) is picked up as an image through the mirror 107 that is set at the angle α with respect to the application target surface of the substrate, and the measured volume $V_1$ of the droplet 201 is calculated from the picked-up image (STEP 12). Subsequently, the measured volume $V_1$ and the target volume $V_0$ are compared with each other (STEP 13), and the necessity of correction is determined depending on whether the volume difference exceeds the allowable range (STEP 14).

If it is determined in STEP 14 that the correction is required, the change rate R ($=(V_1-V_0)/V_0 \times 100$) is calculated from the target volume $V_0$ and the measured volume $V_1$ (STEP 15), and whether the change rate R is plus or minus is determined (STEP 16).

When the change rate R is minus, this means that the measured volume $V_1$ is less than the target volume $V_0$. Therefore, the control parameter in consideration of an increase of the measured volume $V_1$ corresponding to the minus change rate R is calculated from the control data which has been stored in the control unit 104 in advance, to thereby set the ejection pressure again (STEP 17).

When the change rate R is plus, this means that the ejection volume $V_1$ is more than the target volume $V_0$. Therefore, the setting parameter in consideration of an decrease of the ejection volume $V_1$ corresponding to the plus change rate R is calculated from the control data which has been stored in the control unit 104, to thereby set the ejection pressure again (STEP 18).

As a modification of the above-described procedure, the necessity of correction may be determined by calculating only the change rate R without calculating the volume difference. In such a case, STEP 14 is not executed, and the determination is made between STEP 13 to STEP 15 and STEP 16.

A step of calculating roundness of the shape of the droplet 201 on a projected surface as viewed in the vertical direction (i.e., the silhouette of the droplet in a plan), and determining whether a calculated value falls within an allowable range may be added.

[Correction Procedure 2]

Figure 5:
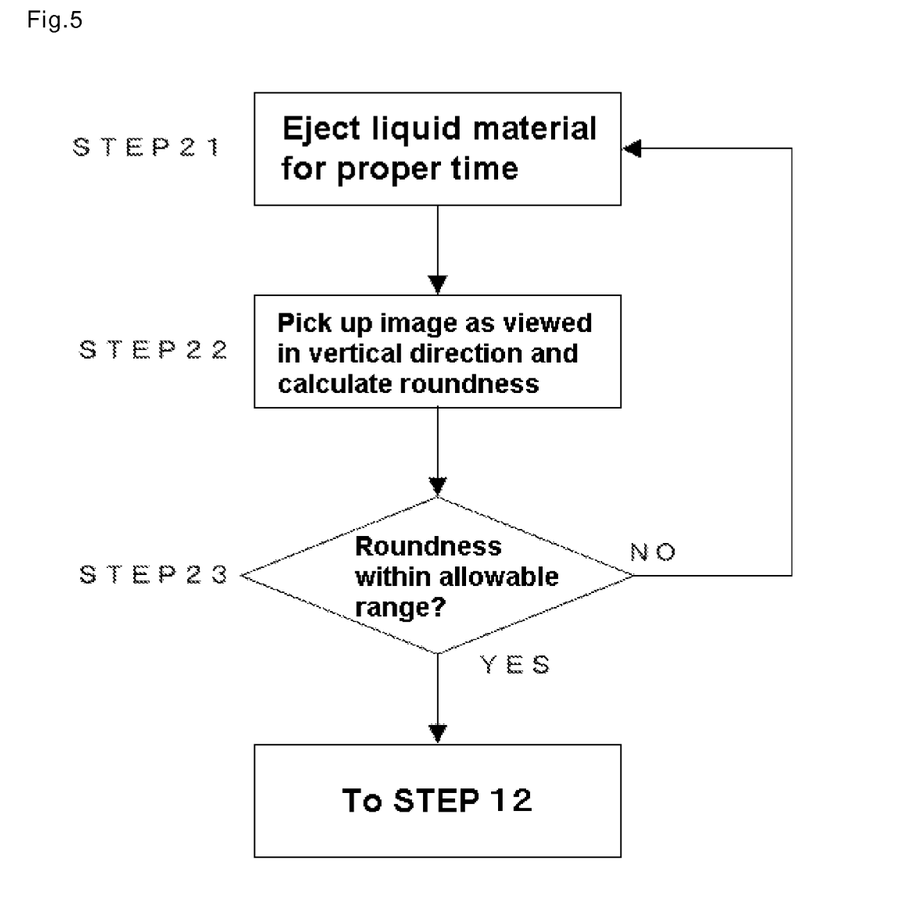
FIG. 5 is a flowchart illustrating a modification of the correction procedure according to Embodiment 1.

A correction procedure 2 in this embodiment is described with reference to a flowchart of FIG. 5 in addition to the flowchart of FIG. 4.

First, as in STEP 11, the liquid material is ejected onto the substrate for the proper ejection time (STEP 21). Next, the shape of the ejected droplet 201 as viewed in the vertical direction relative to the application target surface of the substrate (i.e., the shape of the droplet 201 as viewed from above the application target surface) is picked up as an image, and the roundness of the droplet 201 is calculated from the picked-up image (STEP 22). Herein, the roundness is calculated from a difference between a maximum length and a minimum length of a linear line passing the center of gravity of the shape of the droplet 201 on a projected surface as viewed in the vertical direction relative to the application target surface of the substrate.

In STEP 23, it is determined whether the calculated roundness exceeds the allowable range. If it is determined that the calculated roundness is within the allowable range, the control flow advances to STEP 12 in FIG. 4. Then, the volume of the droplet 201 is calculated and the correction of the ejection amount is executed. If it is determined that the calculated roundness is outside the allowable range, the control flow returns to STEP 21 in which the liquid material is ejected again. In this respect, a predetermined number of times may be set for the return to STEP 21 and an alarm may be issued upon determining the occurrence of an error when the number of returns exceeds the predetermined number of times.

[Volume Calculation Methods]

While there are various methods for calculating the volume, the following two examples are described here.

Figure 6:
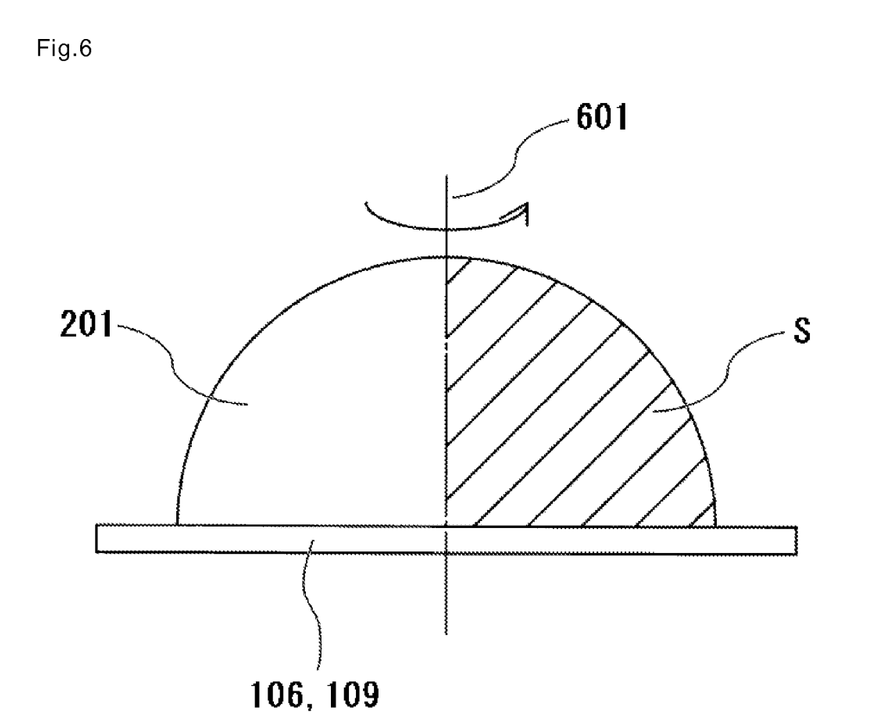
FIG. 6 is an explanatory view to explain a volume calculation method according to Embodiment 1.

(A) Method for Calculating an Area of the Shape on the Projected Plane as Viewed in the Horizontal Direction As indicated by a hatched portion S in FIG. 6, the volume of the applied droplet 201 is calculated by assuming, from the image of the droplet 201 applied to the substrate (106, 109), a flat surface (hatched portion S) having an area that corresponds to a half the shape of the droplet on the projected plane as viewed in the horizontal direction, and further assuming a solid body that is formed by rotating the flat surface about an axis 601 illustrated in FIG. 6. In other words, an area S of the half the shape of the droplet on the projected plane, as viewed in the horizontal direction, (i.e., an area of a sector having a central angle of 90 degrees) is first obtained through image processing from the image of the droplet 201 applied to the substrate (106, 109), and the volume of the droplet 201 is calculated through integration in which the obtained area S is rotated about the axis 601.

(B) Method for Calculating the Volume from the Lengths of a Bottom Side, etc.

Figure 7:
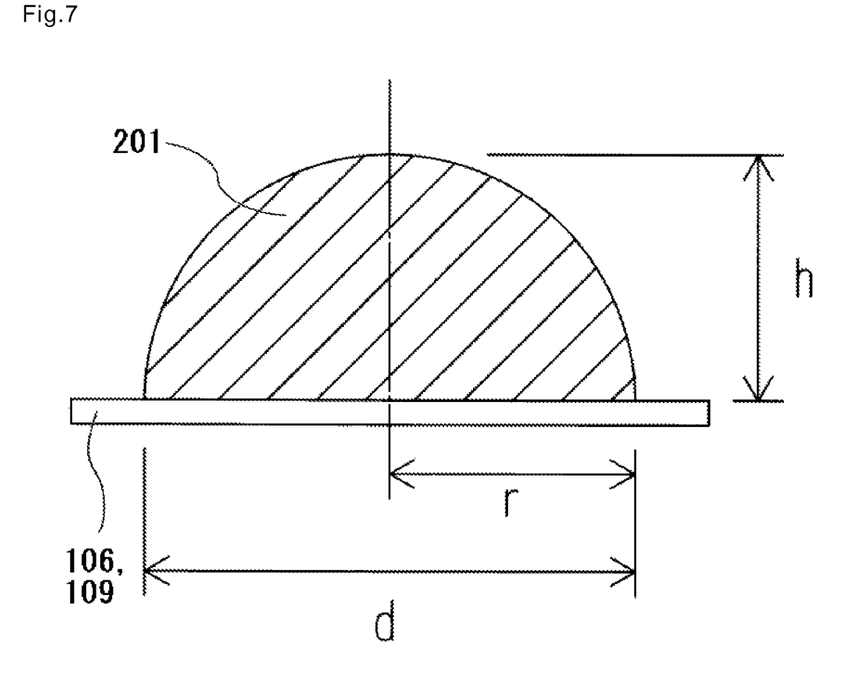
FIG. 7 is an explanatory view to explain the volume calculation method according to Embodiment 1.

The volume of the droplet 201 is calculated by approximating the droplet 201 applied to the substrate (106, 109) with a half sphere or a partial sphere (part of a sphere having a height smaller than the radius of the sphere, such as in a dome-like shape), and calculating the volume of the half sphere or the partial sphere based on a geometrical volume calculation formula. Stated another way, as illustrated in FIG. 7, the volume of the droplet 201 is calculated from the image of the droplet 201 applied to the substrate (106, 109) by using one of the following numerical formulae on an assumption that the length of the bottom side of the shape of the droplet on the projected plane, as viewed in the horizontal direction, is a diameter d, a value of the length of a half the bottom side is a radius r, and the maximum length in the vertical direction is a height h.

$V = 2\pi r^3/3$  [Numerical Formula 1] [Volume of half sphere]

$V = (\pi h/6)(3r^2 + h^2)$  [Numerical Formula 2] [Volume of partial sphere]

According to the applying apparatus of this embodiment, as described above, since the image of the droplet 201 is picked up from a side with the aid of the mirror 107, the shape of the droplet 201 can be more correctly captured and hence the volume of the droplet 201 can be more accurately measured.

The applying apparatus of this embodiment can realize saving of an installation space and reduction of the apparatus size because the necessity of separately installing an additional image pickup device to pick up the image of the droplet 201 is eliminated as a result of using the mirror 107.

Embodiment 2

[Arrangement Including Two Mirrors]

Figure 8:
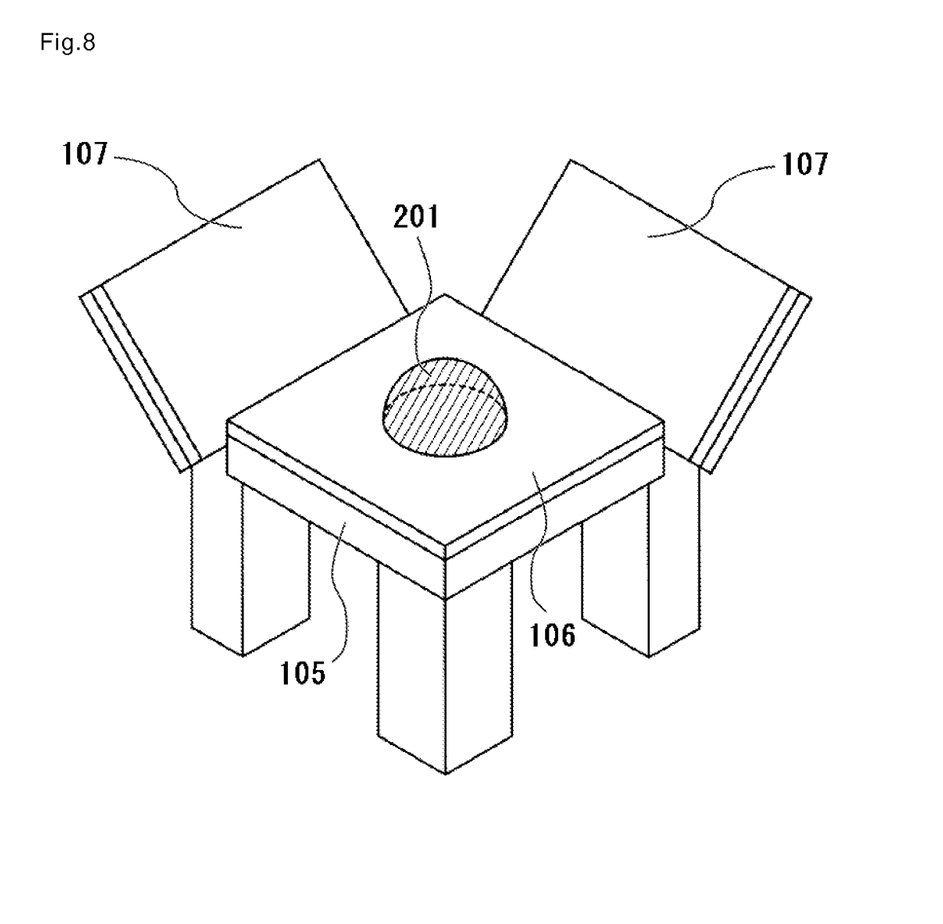
FIG. 8 is an explanatory view to explain a setup example of mirrors according to Embodiment 2.

An applying apparatus of Embodiment 2 differs from the applying apparatus of Embodiment 1 in that the adjustment mechanism 401 includes two mirrors 107.

In the applying apparatus of this embodiment, as illustrated in FIG. 8, two mirrors 107 are set be able to pick up images of the shape of the droplet 201 as viewed in two directions that are parallel to the application target surface of the substrate and that are orthogonal to each other. The two mirrors 107 are set at the same angle α as in Embodiment 1. Further, the two mirrors 107 are set such that their surfaces reflecting respective images are oriented in mutually orthogonal relation with respect to the substrate 106 for adjustment.

In this embodiment, because two mirrors 107 are used, two light sources 111 are required. The two light sources 11 may be constituted by using physically-separate two light sources, or by dividing light from one light source to two rays through an optical system, which are illuminated toward the two mirrors.

When the image of the droplet 201 applied onto the substrate 106 is picked up, the image pickup device 108 is first moved to a location above one mirror 107 where the image of the shape of the droplet 201 on the projected plane as viewed in the horizontal direction (i.e., the side image thereof) is picked up. Next, the image pickup device 108 is moved to a location above the other mirror 107 where the image of the shape of the droplet 201 on the projected plane is picked up in a direction perpendicular to the projected plane for which the image has been first picked up. Further, values (r or d) calculated from respective lengths of bottom sides of the two picked-up images are compared with each other. If those lengths are equal, the volume of the droplet is calculated by assuming the droplet to be a half sphere. If those lengths differ from each other, the volume of the droplet is calculated by assuming the droplet to be a half ellipsoid.

With the arrangement including two orthogonal mirrors 107 according to this embodiment, as described above, the images of the droplet 201 picked up in two directions orthogonal to each other can be obtained. Therefore, the shape of the droplet 201 can be more correctly captured and hence the volume of the droplet 201 can be more accurately measured.

Embodiment 3

[Arrangement Including Rotary Stage]

Figure 9:
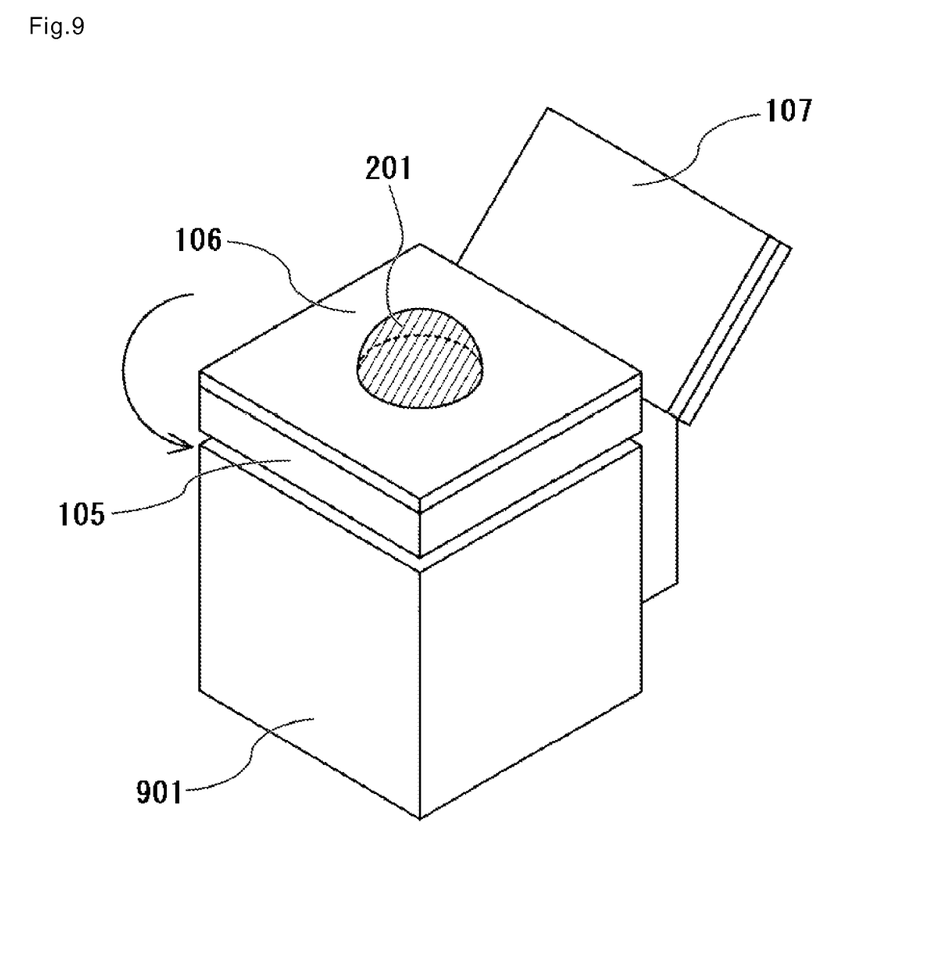
FIG. 9 is an explanatory view to explain a setup example of a mirror according to Embodiment 3.

An applying apparatus of Embodiment 3 is similar to the applying apparatus of Embodiment 1 in that the number of mirrors 107 set near the substrate 106 at a certain angle with respect to the application target surface of the substrate is one and the one mirror 107 is set at the angle α, but it differs from the applying apparatus of Embodiment 1 in that the apparatus includes a rotation drive mechanism 901 for rotating an adjustment stage 105.

In the adjustment mechanism 401 of this embodiment, as illustrated in FIG. 9, the adjustment stage 105 is rotated relative to the mirror 107 by the rotation drive mechanism 901 that is provided under the adjustment stage 105. Because the adjustment stage 105 is rotatable, the image of the droplet 201 as viewed in the horizontal direction can be picked up in two or more directions.

The image of the droplet 201 applied onto the substrate 106 is picked up as follows. First, the image pickup device 108 is moved to the location above the set mirror 107 where the image of the shape of the droplet 201 on the projected plane is picked up as viewed in the horizontal direction relative to the application target surface of the substrate. Next, the adjustment stage 105 is rotated while the position of the image pickup device 108 is held fixed. While an amount of the rotation of the adjustment stage 105 can be optionally selected, it is here assumed that the rotation amount is 90 degrees (corresponding to the case where the number of image pickups is two) or 120 degrees (corresponding to the case where the number of image pickups is three). After stopping the rotation, the side image of the droplet 201 is picked up in one or more different rotational positions. A method of calculating the volume from two or more picked-up images is similar to that described above in Embodiment 2.

With the arrangement of this embodiment including the rotatable adjustment stage 105, as described above, since the images of the droplet 201 picked up in two or more directions are picked up, the shape of the droplet 201 can be more correctly captured and hence the volume of the droplet 201 can be more accurately measured.

The arrangement may be modified such that the mirror is rotated with respect to the substrate without rotating the substrate. However, such a modified arrangement requires a light source or an optical system for causing light to enter the mirror in a way following the rotation of the mirror.

Embodiment 4

[Arrangement Including Conveying Mechanism Capable of Moving the Substrate in One Direction]

Figure 10:
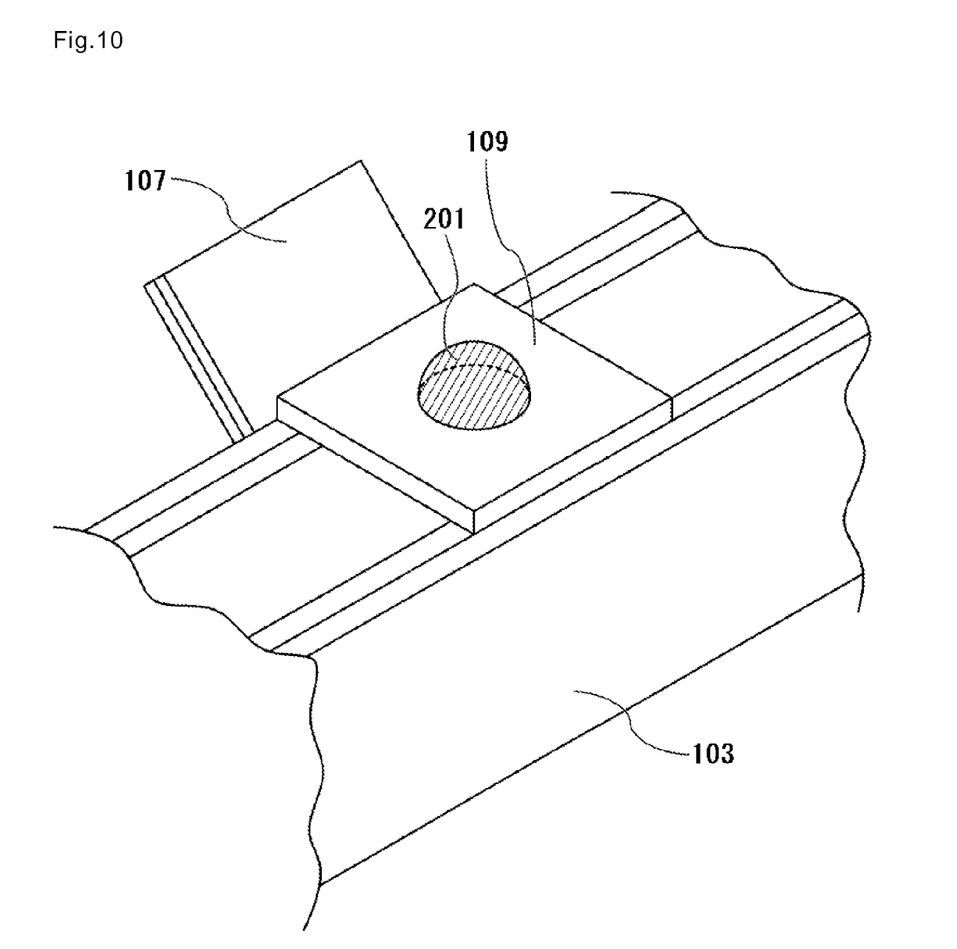
FIG. 10 is an explanatory view to explain a setup example of a mirror according to Embodiment 4.

An applying apparatus of Embodiment 4 includes, as illustrated in FIG. 10, a mirror 107 disposed adjacent to the conveying mechanism 103 that is able to move the substrate 109 in one direction. The mirror 107 is disposed near the location where positioning of the application target substrate 109 placed on the stage is performed. Further, a light source 111 (not shown) is disposed in opposed relation to the mirror 107 with the stage interposed between them.

The image of the droplet 201 applied onto the substrate 106 is picked up in a similar manner to that in Embodiment 1, and a method for calculating the volume of the droplet 201 is also similar to that in Embodiment 1.

With the arrangement of this embodiment, the volume of the droplet 201 is calculated by picking up the image of the droplet 201 applied to the application target substrate 109. Therefore, the time taken for applying the droplet to the substrate 106 for adjustment and the time taken for picking up the image of the substrate 106 for adjustment are no longer required, whereby the time taken for the correction can be cut.

Embodiment 5

Figure 11:
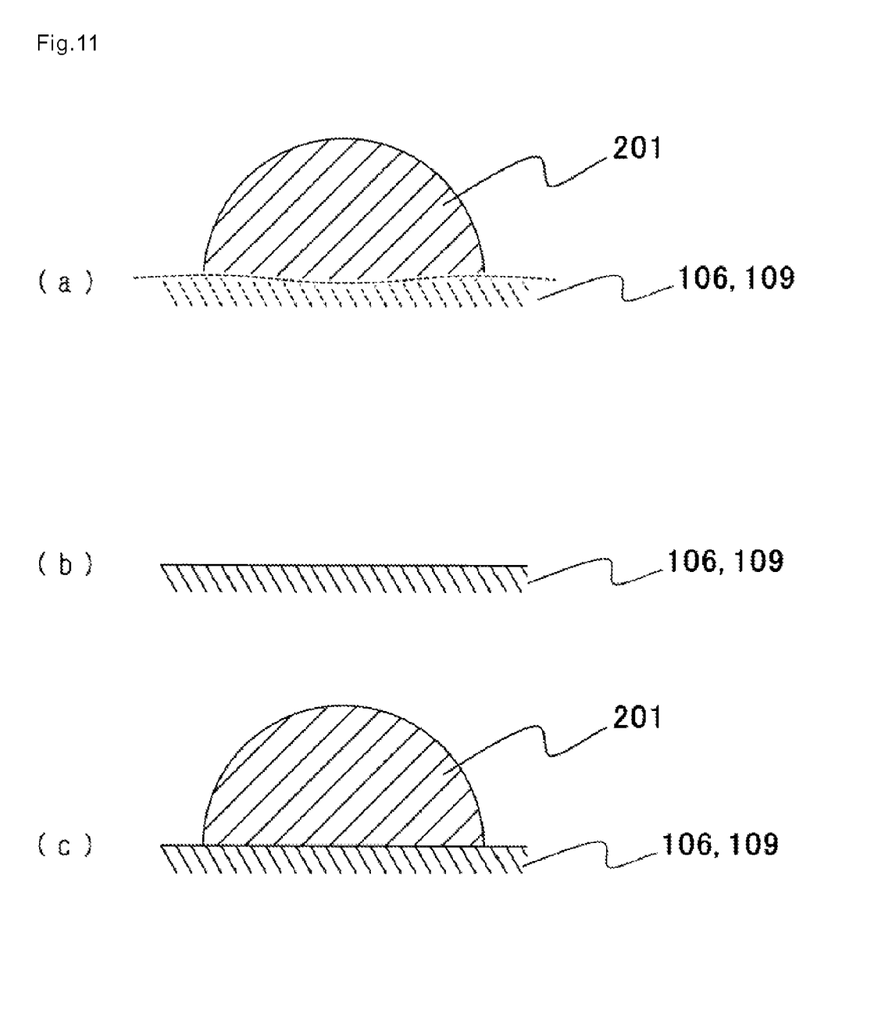
FIG. 11 is an explanatory view to explain an image pickup method according to Embodiment 5.

Depending on the depth of field of a lens attached to the camera, i.e., the image pickup device, a focus is not matched with the substrate when focusing is made on the droplet, and the boundary between the droplet and the substrate, i.e., an edge of the upper surface of the substrate, may become not sharp in the picked-up image (FIG. 11(*a*)). In other words, a boundary line is blurred and an error is caused in recognition of the image and in calculation of the volume in some cases.

In such a case, the following method is executed for the purpose of more accurate measurement.

First, as a preparation step, an image of the substrate before applying the droplet thereto is picked up, and a boundary line of the upper surface of the substrate is recognized and stored (FIG. 11(b)). Thereafter, when the measurement is performed by applying the droplet onto the substrate and picking up an image of the applied droplet, the recognition of the image and the calculation of the volume are executed based on the boundary line that has been stored in the preparation step. In more detail, the volume is calculated by recognizing only an image in a region above the boundary line that has been stored in the preparation step (FIG. 11(c)).

By executing the recognition of the image and the calculation of the volume as described above, the ejection amount of the droplet can be more accurately measured.

When the image of the substrate is picked up before applying the droplet, the focus is preferably adjusted by operating the Z drive mechanism. Further, the pickup of the image of the substrate before applying the droplet is basically required just once unless the positions of the substrate, the camera, etc. are changed.

INDUSTRIAL APPLICABILITY

The present invention can be practiced in various types of devices for ejecting liquid materials.

Examples of an ejection device of the type in which the liquid material comes into contact with the substrate before departing from the ejection device include the air type imposing air under regulated pressure for a predetermined time to the liquid material in a syringe that has a nozzle at its fore end, the tubing type including a flat tubing mechanism or a rotary tubing mechanism, the plunger type moving a plunger, which slides in close contact with an inner surface of a reservoir having a nozzle at its fore end, through a desired distance, thereby ejecting the liquid material, the screw type ejecting the liquid material with rotation of a screw, and the valve type controllably ejecting the liquid material, which is under a desired pressure, with opening/closing of a valve.

Also, examples of an ejection device of the type in which the liquid material comes into contact with the substrate after having departed from the ejection device include the jet type striking a valve body against a valve seat, thereby causing the liquid material to eject in a way flying from the fore end of a nozzle, the plunger jet type moving a plunger-type plunger and then abruptly stopping the plunger, thereby causing the liquid material to eject in a way flying from the fore end of a nozzle, and the ink jet type operating in a continuous jet mode or on demand.

Further, the present invention can be practiced in various applying apparatuses for applying liquid materials in specified application amounts. For example, the present invention can be practiced in a sealant applying apparatus and a liquid crystal dripping apparatus, which are used in steps of manufacturing a liquid crystal panel, as well as in an apparatus for applying a solder paste onto a printed board.

The invention claimed is:

1. An apparatus for applying a liquid material, the apparatus comprising:
    a reservoir configured to reserve the liquid material,
    an ejection device provided with a nozzle configured to eject the liquid material,
    an adjustment stage on which a substrate configured to be adjusted is to be placed,
    a mirror disposed next to the adjustment stage at an angle with respect to an application target surface of the substrate,
    an image pickup device configured to pick up a side-view image reflected by the mirror of a droplet applied to the application target surface of the substrate, the image pickup device including an objective surface through which the image is captured, and
    XYZ drive mechanism configured to move the ejection device and the image pickup device,
    a control unit,
    wherein the image pickup device and the mirror are arranged at a position configured to pick up the side-view image of the droplet formed on the application target surface from a side,
    wherein the image pickup device is arranged above the mirror wherein the objective surface is oriented parallel to the application target surface of the substrate, and
    wherein the image pickup device is configured to recognize a position of an application target substrate.

2. The applying apparatus according to claim 1, further comprising a light source disposed in opposed relation to the mirror.

3. The applying apparatus according to claim 1 or 2, wherein the mirror includes a plurality of mirrors arranged in orthogonal or symmetrical relation, and
    the image pickup device is positioned to be capable of picking up images of the droplet through the mirror at different angles in a horizontal direction.

4. The applying apparatus according to claim 1 or 2, further comprising a stage for rotating the droplet formed on the application target surface.

5. The applying apparatus according to claim 1 or 2, further comprising a mirror that is rotatable with respect to the droplet formed on the application target surface.

6. The applying apparatus according to claim 1 or 2, further comprising a conveying mechanism capable of moving the application target surface in one direction,
    wherein the mirror is set near the conveying mechanism.

7. The applying apparatus according to claim 1 or 2, wherein the predetermined angle is 45 degrees.

8. The applying apparatus according to claim 1 or 2, wherein the substrate for adjustment is a flat substrate.

9. The applying apparatus according to claim 1 or 2, further comprising a conveying mechanism for conveying the application target substrate,
    wherein the substrate for adjustment on the adjustment stage is at the same level as the application target substrate on the conveying mechanism.

* * * * *